United States Patent
Lee et al.

(10) Patent No.: US 8,327,878 B2
(45) Date of Patent: Dec. 11, 2012

(54) CHAMBER ISOLATION VALVE RF GROUNDING

(75) Inventors: Ke Ling Lee, Cupertino, CA (US); Shinichi Kurita, San Jose, CA (US); Emanuel Beer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 679 days.

(21) Appl. No.: 12/333,043

(22) Filed: Dec. 11, 2008

(65) Prior Publication Data

US 2009/0090883 A1  Apr. 9, 2009

Related U.S. Application Data

(62) Division of application No. 11/174,229, filed on Jul. 1, 2005, now Pat. No. 7,469,715.

(51) Int. Cl.
*H01J 37/32* (2006.01)
(52) U.S. Cl. ......... 137/554; 251/193; 277/919; 277/920
(58) Field of Classification Search .......... 251/193, 251/195, 196; 277/919, 920; 137/554
See application file for complete search history.

(56) References Cited

U.S. PATENT DOCUMENTS

| | | | |
|---|---|---|---|
| 3,524,467 A | 8/1970 | Worley | |
| 3,596,874 A | 8/1971 | Di Santo | |
| 4,244,557 A | 1/1981 | Polhede et al. | |
| 4,343,455 A | 8/1982 | Winkler et al. | |
| 4,381,100 A | 4/1983 | Schoenberg | |
| 4,681,329 A | 7/1987 | Contin | |
| 5,087,017 A | 2/1992 | Sawa et al. | |
| 6,121,545 A | 9/2000 | Peng et al. | |
| 6,302,372 B1 | 10/2001 | Sauer et al. | |
| 6,347,918 B1 | 2/2002 | Blahnik | |
| 6,347,919 B1 | 2/2002 | Ryan et al. | |
| 6,561,484 B2 | 5/2003 | Nakagawa et al. | |
| 6,598,615 B1 | 7/2003 | Holland et al. | |
| 6,634,845 B1 | 10/2003 | Komino | |
| 6,800,172 B2 | 10/2004 | Carpenter et al. | |
| 6,854,708 B2 * | 2/2005 | Contin et al. | 251/167 |
| 2002/0074534 A1 | 6/2002 | Nakagawa et al. | |
| 2004/0245489 A1 | 12/2004 | Kurita et al. | |

FOREIGN PATENT DOCUMENTS

JP  04-066205  3/1992

(Continued)

OTHER PUBLICATIONS

Japanese Office Action for Application No. 2006-00288005, dated May 31, 2011.

(Continued)

*Primary Examiner* — John Bastianelli
(74) *Attorney, Agent, or Firm* — Patterson & Sheridan, LLP (57) ABSTRACT

Methods and apparatus for grounding a chamber isolation valve for a processing system are provided. In one embodiment, a grounded chamber isolation valve for a plasma processing system is described. The chamber isolation valve includes a door and a bracing member movably attached to and opposing the door, and at least one electrically conductive member in electrical communication with the door, the at least one electrically conductive member comprising one or more reaction bumpers disposed on the bracing member that are adapted to contact at least one grounded component of the plasma processing system when the door is in the closed position.

19 Claims, 11 Drawing Sheets

FOREIGN PATENT DOCUMENTS

| | | |
|---|---|---|
| JP | 06-045253 A | 2/1994 |
| JP | 10-110834 A | 4/1998 |
| JP | 2001-002241 | 1/2001 |
| JP | 2001002241 A | 1/2001 |
| JP | 2002-181205 | 6/2002 |
| JP | 2004-335977 | 11/2004 |

OTHER PUBLICATIONS

International Search Report Dated Oct. 31, 2006 for EP 06 00 2668.
Official Letter dated Oct. 20, 2011, from Japanese Patent Office for corresponding Japan Patent Application No. 2006-002880.

* cited by examiner

FIG. 9

US 8,327,878 B2

CHAMBER ISOLATION VALVE RF GROUNDING

CROSS-REFERENCE TO RELATED APPLICATIONS

This application is a divisional of U.S. patent application Ser. No. 11/174,229, filed Jul. 1, 2005, which is herein incorporated by reference.

BACKGROUND OF THE INVENTION

1. Field of the Invention

Embodiments of the present invention generally relate to electronic device manufacturing and more particularly to methods and apparatus for preventing plasma leakage around a plasma processing chamber isolation valve.

2. Description of the Related Art

A substrate processing chamber typically communicates with a substrate transfer chamber through a sealable opening that is both wide and relatively short to accommodate insertion and removal of horizontally-oriented substrates. It is known to use a chamber isolation valve, also known as a slit valve, to seal such an opening. For example, a sealing plate, also known as a door, of the chamber isolation valve may be extended to seal the opening, and retracted to permit passage of substrates through the opening. Chamber isolation valve designs that avoid the problems of (1) particle generation through rubbing friction and/or repeated metal-to-metal contact during operation, and (2) uneven compression of resilient sealing elements, are preferred.

As substrate processing chambers increase in size and the required plasma power for plasma-processing substrates exceeds 10 kW, complete containment of plasma in such chambers has become problematic. Ordinarily, electrically grounded conductive surfaces, e.g., the metallic chamber walls, substantially contain the plasma present in a PVD, PECVD or other plasma processing chambers during substrate processing. In some instances, however, plasma leakage has occurred from processing chambers, escaping past the closed isolation valve door and into adjacent chambers. This is particularly true for chambers processing very large substrates, i.e., larger than about 1,000 mm×1,000 mm.

Accordingly, a need exists for improved methods and apparatus for grounding a chamber isolation valve to prevent plasma leakage past the isolation valve while avoiding metal-to-metal contact between components of the isolation valve and its associated sealing surfaces. The improved methods and apparatus should be applicable for isolation valves operating against large pressure differentials between chambers.

SUMMARY OF THE INVENTION

Embodiments of the invention provide methods and apparatus for grounding a chamber isolation valve. In one embodiment, a grounded chamber isolation valve for a plasma processing system is described. The chamber isolation valve includes a door and a bracing member movably attached to and opposing the door, and at least one electrically conductive member in electrical communication with the door, the at least one electrically conductive member comprising one or more reaction bumpers disposed on the bracing member that are adapted to contact at least one grounded component of the plasma processing system when the door is in the closed position.

In another embodiment, a grounded chamber isolation valve for a plasma processing system is described. The chamber isolation valve includes a door and a bracing member movably attached to and opposing the door, and at least one electrically conductive surface comprising a conductive part of the bracing member that is in electrical communication with the door and adapted to contact at least one grounded component of the plasma processing system when the door is in the closed position, wherein the at least one grounded component of the plasma processing system comprises an electrically conductive member.

In another embodiment, an apparatus is described. The apparatus includes a closure member movably disposed between a first opening in a first chamber and a second opening in a second chamber. The closure member comprises a door, and a bracing member, the door and the bracing member being movable relative to each other. The apparatus further includes a conductive member disposed on and extending from the closure member, the conductive member electrically coupling the door and a sealing surface proximate the first opening when the bracing member and the door are moved away from each other.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures.

DETAILED DESCRIPTION

A method and apparatus for grounding a chamber isolation valve is disclosed. Generally, the method makes use of an electrically conductive elastomeric member or members to effectively ground a chamber isolation valve and/or isolation valve door while avoiding metal-to-metal contact between moving parts in the processing system. In one aspect, the elastomeric member is fixedly attached to and in electrical communication with the door of the chamber isolation valve. The elastomeric member is brought into contact with a grounded component of the plasma processing system when the door is deployed in the closed position, i.e., during substrate processing in the plasma processing chamber. In another aspect, the conductive elastomeric member is fixedly attached to a bracing member of a chamber isolation valve and is brought into contact with a grounded component of the plasma processing system when the bracing member is deployed to hold the isolation valve door in place during substrate processing. In another aspect, the electrically conductive elastomeric member used to ground the isolation valve is fixedly attached to a grounded component of the plasma processing system, such as a chamber wall, and a conductive member or members of the isolation valve is brought into contact with the elastomeric member when the door is in the closed position. The conductive member or members may be in electrical communication with either the isolation valve door, the isolation valve bracing member and/or both.

Figure 1:
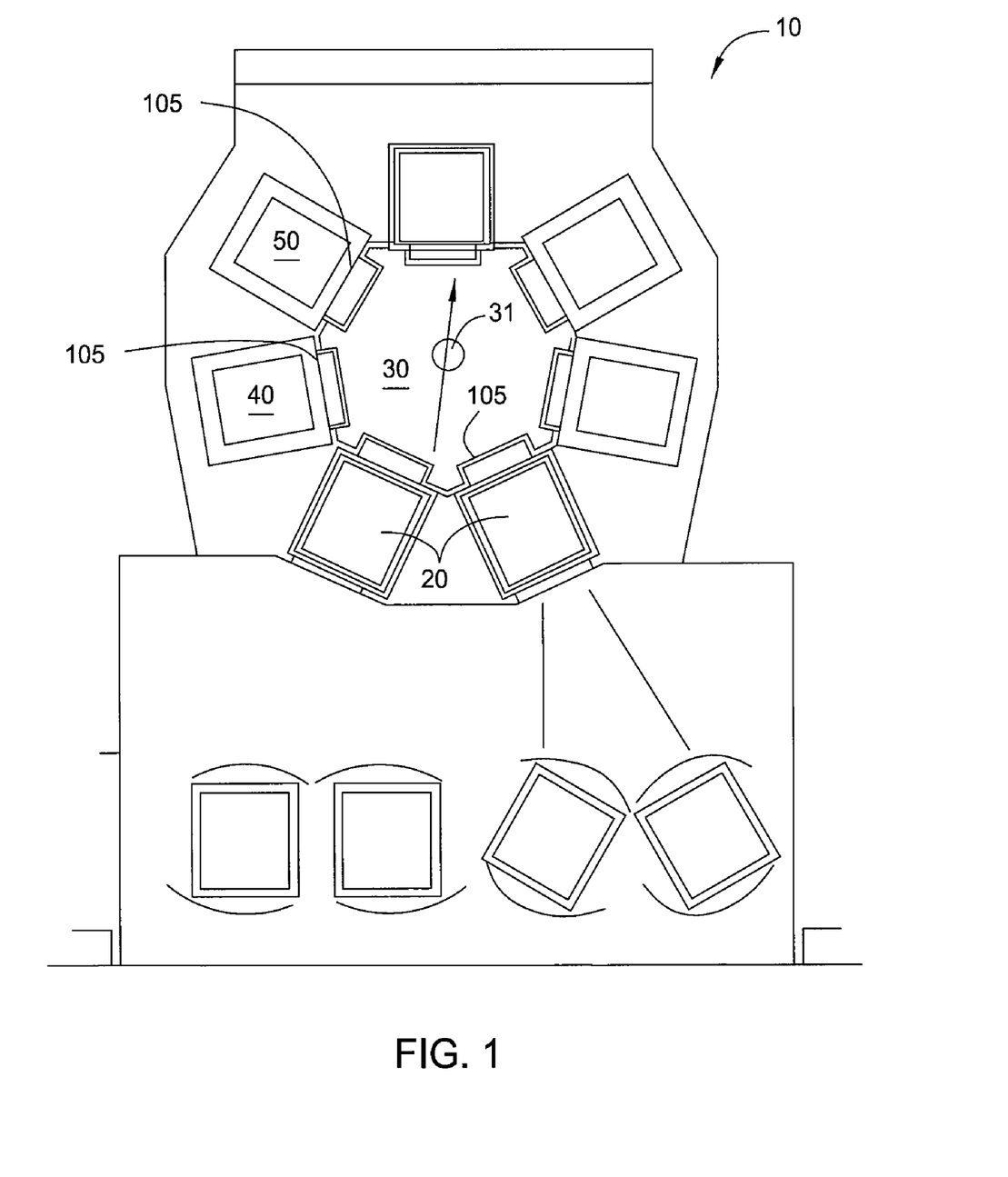
FIG. 1 is a schematic plan view of an exemplary substrate processing system that may be adapted to benefit from the invention.

FIG. 1 is a schematic plan view of an exemplary substrate processing system 10 that may be adapted to benefit from the invention. Substrate processing system 10 may include a load lock 20, a transfer chamber 30, a transfer robot 31, and multiple substrate processing chambers 40 and 50. Load lock 20 allows the introduction of one or more substrates into the vacuum environment of substrate processing system 10 without pressurizing the entire system to atmospheric pressure. Substrates are processed in processing chambers 40 and 50. Substrate processing chambers 40 and 50 may perform such processes on substrates as physical vapor deposition (PVD) and plasma-enhanced chemical vapor deposition (PECVD), for example. Typically substrate processing chambers 40 and 50 must be isolated from each other to minimize infiltration of incompatible process gases and because different processes may require significantly different levels of vacuum. Transfer robot 31 inside transfer chamber 30 transfers substrates (not shown) between substrate processing chambers 40 and 50 and load lock 20 as required. Typically each chamber of substrate processing system 10 may be isolated from all other chambers by means of one or more chamber isolation valves. In some instances, the mechanisms for chamber isolation valves are located substantially inside transfer chamber 30. For larger substrates, such as those used to create flat panel displays, it is generally unfeasible to locate the chamber isolation valves in transfer chamber 30, load lock 20 or the substrate processing chambers 40 or 50 of substrate processing system 10. Instead, chamber isolation valves are typically located between transfer chamber 30 and their associated chamber in a valve housing 105.

Figure 2:
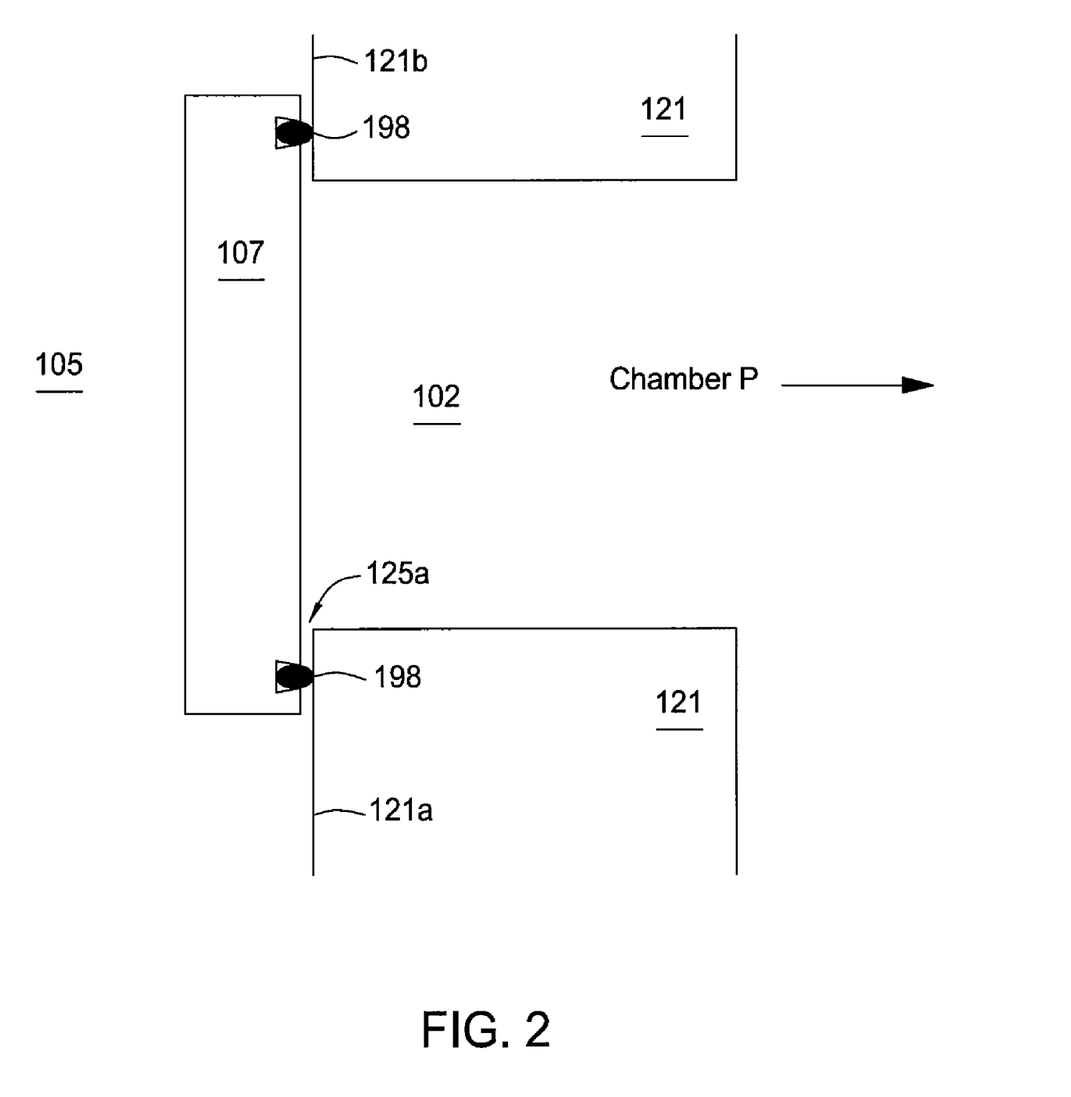
FIG. 2 shows a schematic side view of a chamber isolation valve door sealing a processing chamber opening.

Although chamber isolation valves and isolation valve doors largely consist of metallic, i.e., electrically conductive, components, the use of non-conductive seals, gaskets, and other members therein often results in a poor or non-existent ground path for the isolation valve door. For example, FIG. 2 shows a schematic side view of a chamber isolation valve door 107 sealing chamber opening 102 by closing against front plate sealing surface 121a. Chamber opening 102 is formed through an electrically grounded outer wall of a processing chamber P or through the electrically grounded front plate 121 of valve housing 105. Valve housing 105 and front plate 121 are shown more clearly in FIGS. 4A, 4B and 4C and discussed in more detail below. In order for chamber isolation valve door 107 to be electrically grounded against front plate sealing surface 121a when in the closed position, metal-to-metal contact would have to be made between the chamber isolation valve door 107 and front plate sealing surface 121a. However, metal-to-metal contact between moving parts during normal operation of a processing chamber is known to generate unacceptable levels of particle contamination. Instead, chamber isolation valve door 107 includes an elastomeric sealing member 198 that seals chamber opening 102 in a vacuum-tight manner and is typically sized to prevent metallic chamber isolation valve door 107 from contacting metallic front plate sealing surface 121a. This leaves a narrow gap 125a between chamber isolation valve door 107 and front plate sealing surface 121a. Hence chamber isolation valve door 107 is not electrically grounded and will not shield valve housing 105 and transfer chamber 30 from plasma generated in the processing chamber.

Because of this, plasma formed in processing chamber 40 or 50 is not shielded at the chamber opening 102 and escapes past chamber isolation valve door 107 into valve housing 105 and/or transfer chamber 30. One problem associated with plasma leakage out of processing chambers 40 or 50 is the unwanted deposition of material on surfaces in transfer chamber 30 and valve housing 105, which may later generate substrate-damaging particle contamination. Another problem is that the presence of plasma in transfer chamber 30 may damage surfaces exposed to the plasma via plasma etching, increasing the surface roughness thereof. These surfaces may be difficult to clean and unless repaired or replaced may result in increased particle contamination which may damage substrates. A third problem is the potential for charging of and arcing from components inside transfer chamber 30 and/or valve housing 105. Arcing may cause severe particle contamination of substrates being processed in processing system 10, severe damage directly to such substrates and damage to sensitive components inside processing system 10.

During certain types of substrate processing steps, a pressure differential may exist between processing chambers 40 and/or 50 and transfer chamber 30 such that high pressure within processing chamber 40 or 50 pushes outward against the sealing plate, or door, of the chamber isolation valve. The chamber isolation valve is thereby subjected to stress and fatigue, which both increase with higher pressure differential. Pressure differential effects are exacerbated when large substrates, such as those employed for flat panel displays, are involved since the doors of chamber isolation valves must seal a larger opening.

Figure 3A:
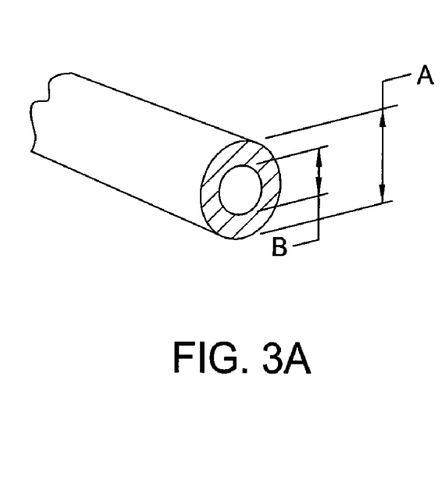
FIGS. 3A, 3B and 3C illustrate segments of an O-strip, a D-strip and a P-strip, respectively.
Figure 3B:
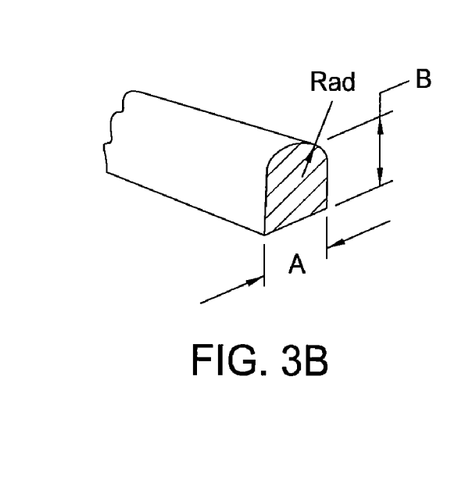
Figure 3C:
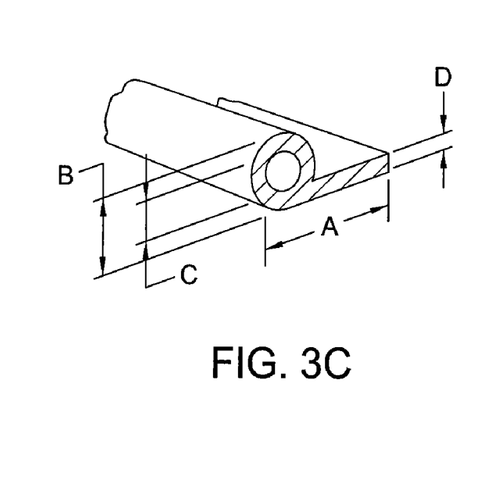

"Electrically conductive," as used herein when describing elastomers, refers to materials that, while not necessarily as conductive of electrical current as a metallic substance, possess no more volume resistivity than about 0.200 ohm-cm. "O-strips", "D-strips" and "P-strips" are elastomeric extrusions that are exemplary embodiments of elastomeric members that may be used in some embodiments of the invention. FIGS. 3A, 3B and 3C illustrate segments of an O-strip, a D-strip and a P-strip, respectively.

Figure 4A:
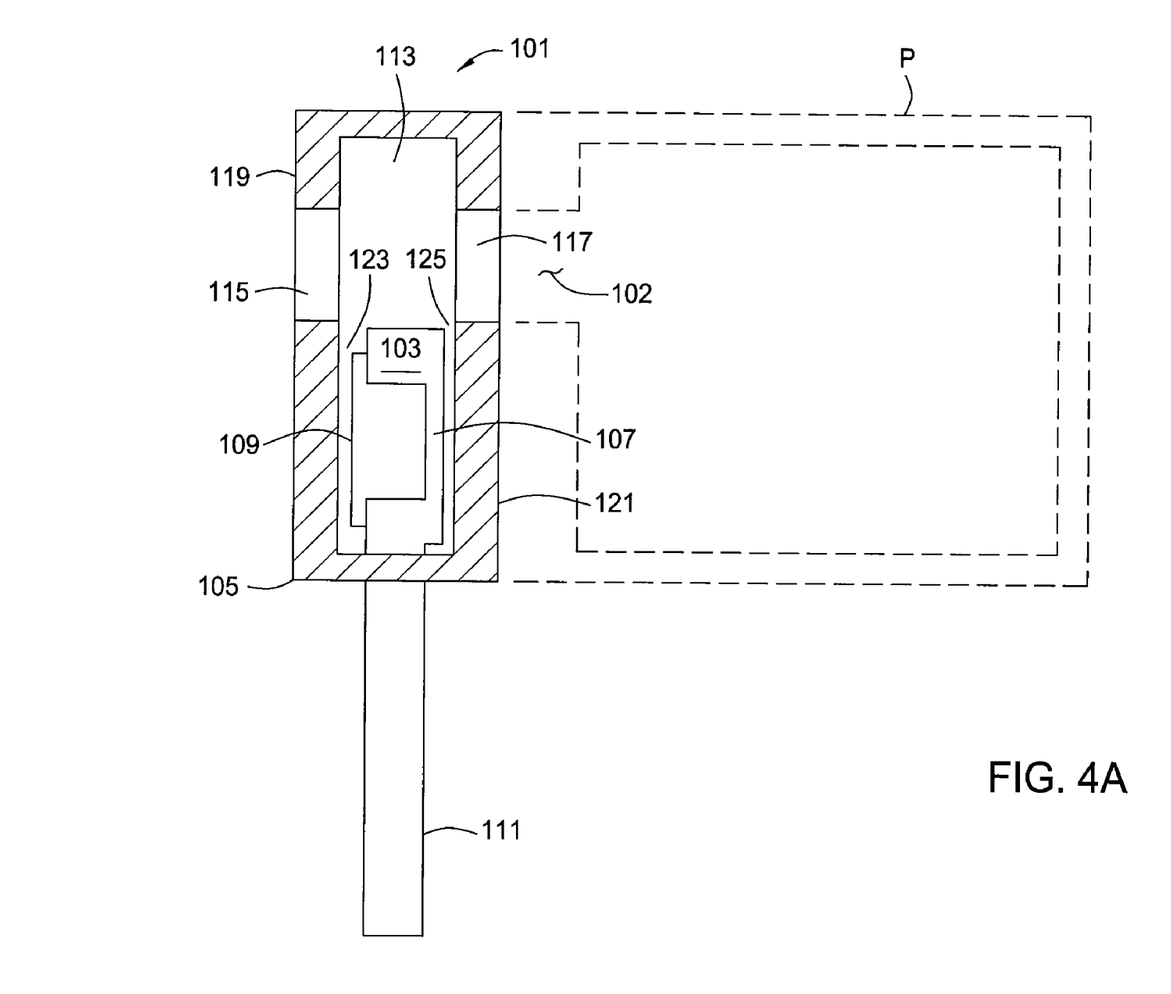
FIGS. 4A-4C are vertical sectional views of a chamber isolation valve that may be adapted to benefit from the invention.
Figure 4B:
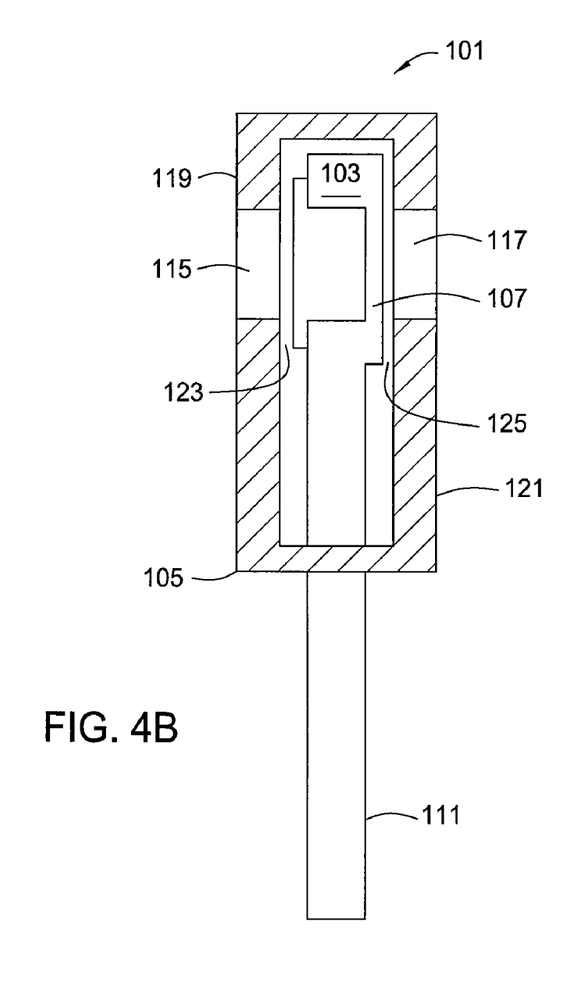
Figure 4C:
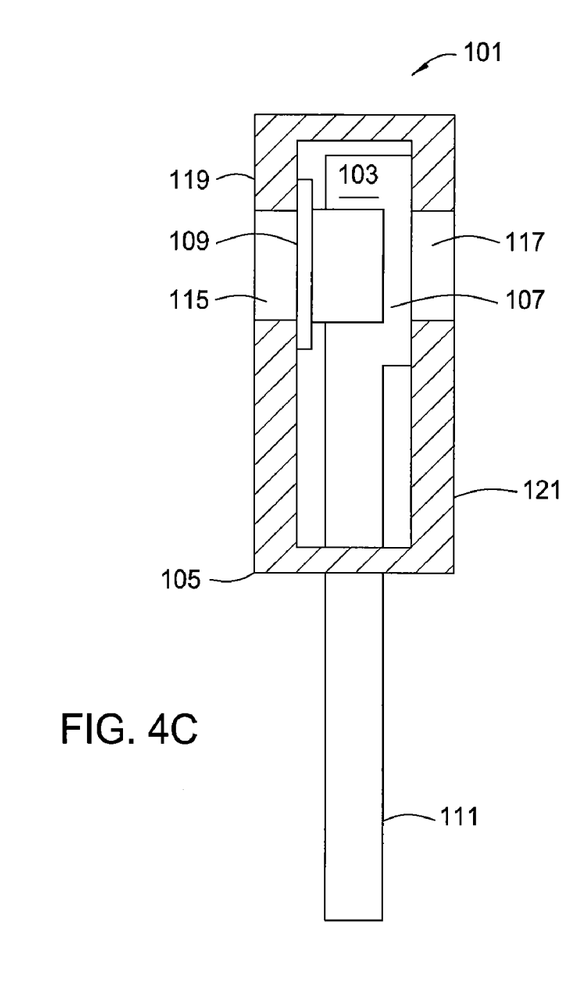

FIGS. 4A-4C illustrate a chamber isolation valve 101 that may be adapted to benefit from the invention. Chamber isolation valve 101 seals an opening 102 (shown in phantom in FIG. 4A) to an adjacent processing chamber P (shown in phantom in FIG. 4A) so as to permit pressurization of the processing chamber P for processing of a substrate contained therein. As illustrated in FIG. 2, elastomeric sealing member 198 creates the seal around opening 102 required to allow the pressurization of chamber P.

Conventional chamber isolation valves typically are not designed to accommodate the large pressure differentials associated with the plasma-processing of large substrates, such as flat panels. An improved apparatus and method has been developed incorporating a moveable bracing member into the chamber isolation valve which exerts a supportive bracing force on the isolation valve door when closed. The method and apparatus incorporating a bracing member and bracing force into a chamber isolation valve are discussed in detail below in conjunction with FIGS. 4A, 4B, and 4C and in U.S. Pat. No. 7,086,638 entitled "Methods and Apparatus For Sealing an Opening of a Processing Chamber," filed on May 12, 2004 and issued on Aug. 8, 2006.

Referring to FIGS. 4A-4C, the chamber isolation valve 101 may include a closure member 103 for sealing the chamber opening 102. In addition, the chamber isolation valve 101 may include a valve housing 105 within which at least a portion of the closure member 103 may be movably disposed. To permit the chamber isolation valve 101 to be used in conjunction with opening 102 of processing chamber P, the valve housing 105 of the chamber isolation valve 101 may be placed against the processing chamber, such that a seal (not shown) is formed between the valve housing 105 and the processing chamber opening to be sealed.

The closure member 103 may include a chamber isolation valve door 107 for sealing the chamber opening 102. For example, chamber isolation valve door 107 may be utilized so as to seal the chamber opening 102 indirectly, e.g., by sealing an opening to the valve housing 105 that is aligned with the chamber opening 102. Alternatively, when valve housing 105 is not present, chamber isolation valve door 107 may be placed in direct contact (not shown) with the processing chamber P such that chamber isolation valve door 107 seals around the chamber opening 102.

The closure member 103 may further include a bracing member 109 that is movable relative to chamber isolation valve door 107. For example, the bracing member 109 may be adapted to extend away from and retract toward chamber isolation valve door 107. Further, bracing member 109 may be adapted to brace or buttress chamber isolation valve door 107, for example, when chamber isolation valve door 107 is in position to seal the chamber opening 102 as described above. Such an arrangement is inherently efficient compared to commonly utilized cantilevered configurations in that it decreases the magnitude of force needed to counter a positive pressure within processing chamber P.

To provide for movement of the closure member 103 relative to the chamber opening 102, closure member 103 may also include an extended portion 111 extending downward from chamber isolation valve door 107. In such an embodiment, an end of extended portion 111 that is spaced away from chamber isolation valve door 107 may be adapted to be manipulated by an actuator disposed inside or outside the valve housing 105. This enables closure member 103 to be moved as a unit, e.g., by moving both chamber isolation valve door 107 and bracing member 109 together via extended portion 111. For example, closure member 103 may be moved horizontally via extended portion 111 toward and/or away from the chamber opening 102, between the configurations of chamber isolation valve 101 shown in FIGS. 4B and 4C, respectively. Alternatively, closure member 103 may be moved vertically via extended portion 111 between the configurations of chamber isolation valve 101 shown in FIGS. 4A and 4B, respectively.

Valve housing 105 may define an enclosure 113, a first opening 115 to enclosure 113, and a second opening 117 to enclosure 113. First opening 115 is typically adjacent to and allows access to the interior of transfer chamber 30. As shown in FIGS. 4A-C, first opening 115 and enclosure 113 are aligned along a common axis with chamber opening 102 and are sized so as to permit passage of substrates through valve housing 105 and into and out of processing chamber P when closure member 103 is in the open position. Second opening 117 may be placed in pneumatic communication with chamber opening 102 such that second opening 117 essentially forms an extension of chamber opening 102.

In embodiments of chamber isolation valve 101 intended for sealing a processing chamber in the presence of a large pressure differential, valve housing 105 may further include a rear plate 119 within which first opening 115 is formed. The rear plate 119 may be adapted to permit the bracing member 109 to contact rear plate 119 and push against rear plate 119 for bracing chamber isolation valve door 107 of the closure member 103 during sealing as described further below. Valve housing 105 may further comprise a front plate 121, within which the second opening 117 is formed. Front plate 121 may be adapted to permit chamber isolation valve door 107 of closure member 103 to contact the front plate 121 and seal around second opening 117. Alternatively, as discussed above, chamber isolation valve door 107 may directly contact processing chamber P to seal chamber opening 102.

In operation, as shown in FIG. 4A, closure member 103 of chamber isolation valve 101 is adapted to assume a retracted position relative to first and second openings 115 and 117 wherein closure member 103 is spaced away from (e.g., below) first and second openings 115 and 117. Such a configuration permits substrates to be passed through valve housing 105 and into and out of the processing chamber P. As also shown in FIG. 4A, enclosure 113 of valve housing 105 preferably encloses chamber isolation valve door 107 and bracing member 109 with space to spare. This provides a first gap 123 between bracing member 109 and rear plate 119 and a second gap 125, between chamber isolation valve door 107 and front plate 121. Note that second gap 125 is slightly wider than and to be distinguished from narrow gap 125a, shown in FIG. 2. During vertical motion of closure member 103, i.e., during opening and closing of chamber isolation valve 101, first and second gaps 123 and 125 are maintained. The presence of first and second gaps 123 and 125 avoids particle-generating rubbing between chamber isolation valve door 107 and surfaces 121a and 121b and between bracing member 109 and rear plate surface 119a.

Figure 5:
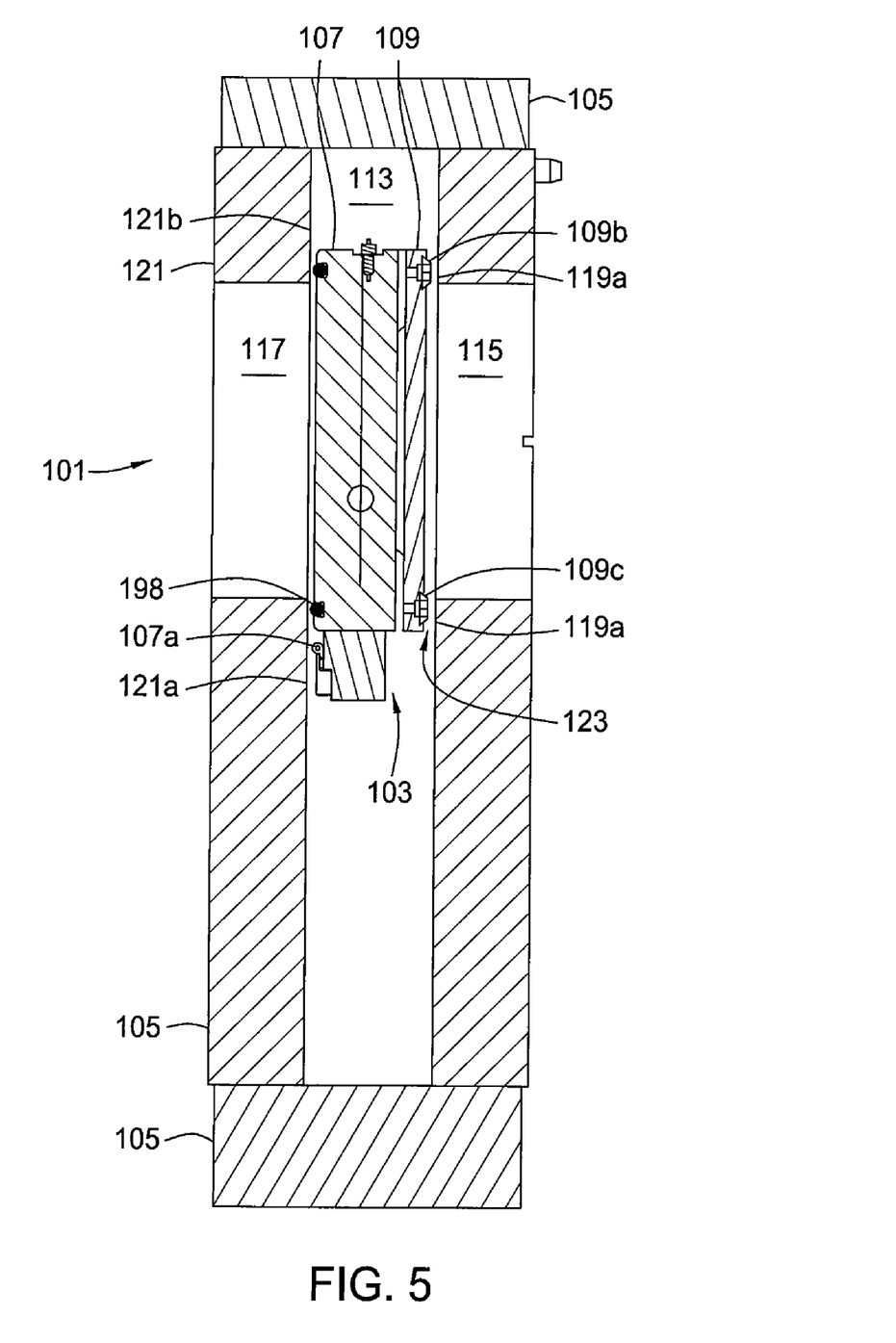
FIG. 5 is a vertical sectional view of one example of a chamber isolation valve with a bracing member deployed in the same position as shown in the schematic side view illustrated in FIG. 4B.

FIG. 4B shows closure member 103 deployed in front of first and second openings 115 and 117, but in a retracted, or unsealed, position relative to second opening 117 of valve housing 115. Second gap 125 is still present between chamber isolation valve door 107 of closure member 103 and front plate 121. FIG. 4C shows closure member 103 after being deployed into a fully closed position, i.e., chamber isolation valve door 107 is in contact with surfaces 121a and 121b of front plate 121 and has formed a seal over second opening 117 of valve housing 105 with elastomeric sealing member 198. Contact surfaces 121a and 121b are shown in FIG. 5. Although not shown for clarity in FIG. 4C, narrow gap 125a (see FIG. 2) is still present between chamber isolation valve door 107 and metallic front plate sealing surfaces 121a and 121b of front plate 121. Narrow gap 125a and elastomeric sealing member 198 are illustrated clearly in FIG. 2. Preferably, as demonstrated by chamber isolation valve 101 shown in FIGS. 4B and 4C, the motion of chamber isolation valve door 107 is normal relative to front plate 121, to reduce and/or eliminate particle generation via rubbing.

In embodiments of chamber isolation valve 101 intended for sealing a processing chamber in the presence of a large pressure differential and as shown in FIG. 4C, chamber isolation valve 101 may be adapted to generate a separation force that moves bracing member 109 relative to chamber isolation valve door 107 so as to cause bracing member 109 to move away from chamber opening 102 and into contact with rear plate 119 of the valve housing 105. Alternatively, the bracing member 109 may be caused to contact a portion of the transfer chamber (not shown), or another structural member prior to chamber isolation valve door 107 contacting front plate 121 or processing chamber P. In this aspect, the chamber isolation valve 101 may then generate a bracing force, also tending to urge the bracing member 109 away from chamber isolation valve door 107, so as to brace or buttress chamber isolation valve door 107 of closure member 103 against front plate 121 of valve housing 105, or against processing chamber P. Such a bracing force may be generated in any number of ways and at any number of locations relative to closure member 103, such as via a pneumatic or other actuator.

FIG. 5 illustrates a vertical sectional view of one example of a chamber isolation valve 101 with a bracing member 109 deployed in the same position in valve housing 105 as the schematic side view illustrated in FIG. 4B. Closure member 103 is deployed in front of first and second openings 115 and 117, but sealing contact between chamber isolation valve door 107 and front plate sealing surface 121a has not been established. Second gap 125 (not shown in FIG. 5 for clarity) is present between chamber isolation valve door 107 and front plate sealing surface 121a and first gap 123 is present between bracing member 109 and rear plate surface 119a. In this example, bracing member 109 contains at least one upper reaction bumper 109b and at least one lower reaction bumper 109c. Reaction bumpers 109b and 109c are preferably formed from a durable, resilient, vacuum-compatible material, such as polyetheretherketone (PEEK) to minimize particle generation during actuation of bracing member 109. Typically, for relatively wide chamber isolation valves, such as those required for 300 mm silicon wafers and flat panel display substrates, bracing member 109 may contain multiple reaction bumpers along the top and bottom of bracing member 109. A configuration with multiple reaction bumpers along the top and bottom of bracing member 109 is more likely to avoid metal-to-metal contact between bracing member 109 and rear plate surface 119a.

Figure 6:
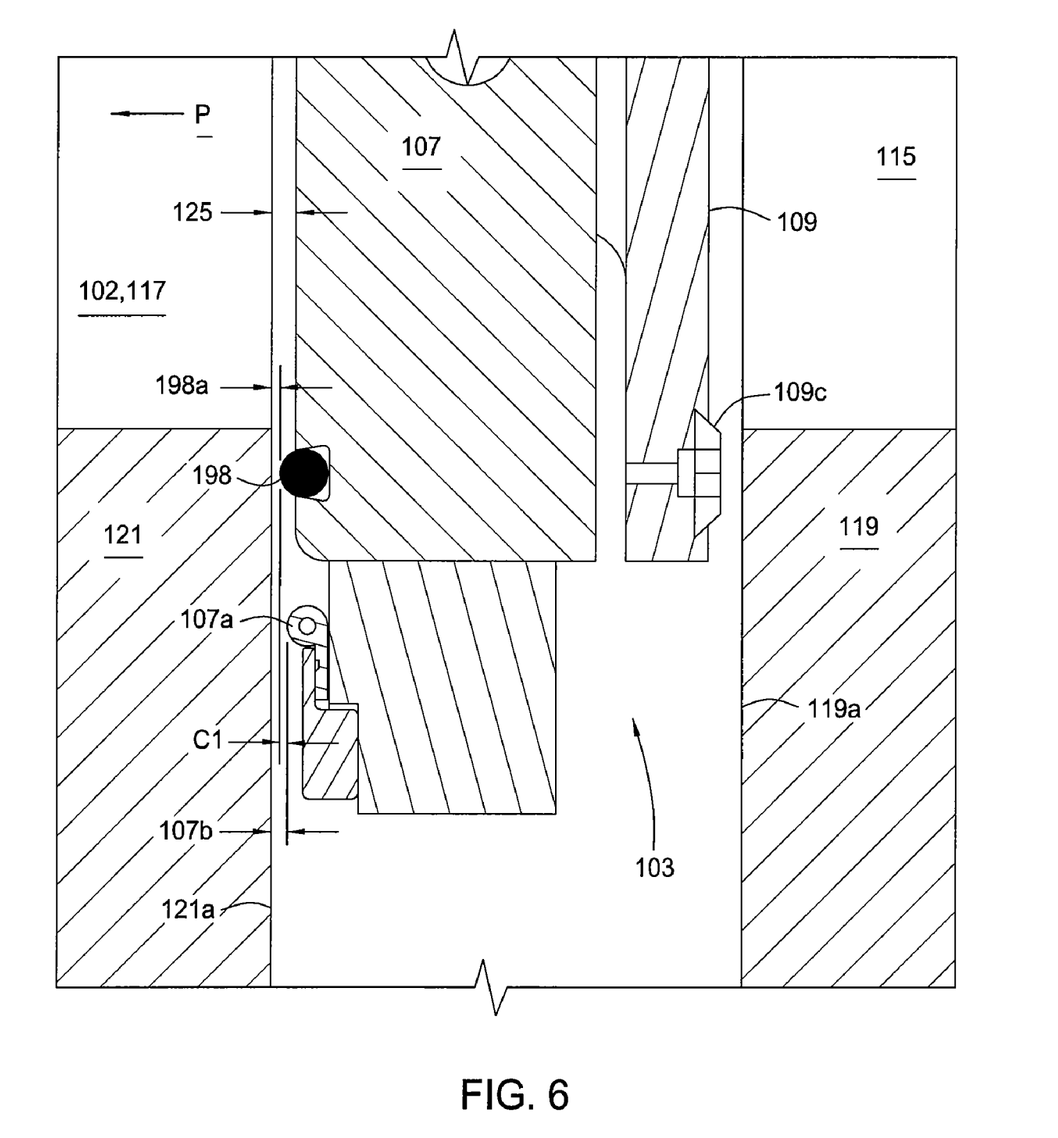
FIG. 6 is a partial vertical sectional view of a chamber isolation valve with a bracing member as shown previously in FIG. 5.

In one aspect of the invention, an electrically conductive elastomeric member 107a, shown in FIGS. 5 and 6, is fixedly attached to and in electrical communication with chamber isolation valve door 107 of the chamber isolation valve 101. Electrically conductive elastomeric member 107a is preferably a silicone-based elastomer. In order to act effectively as an electrical ground path for chamber isolation valve door 107, conductive elastomeric member 107a must have a maximum volume resistivity of about 0.200 ohm-cm and preferably about 0.010 ohm-cm. It is important to note that the volume resistivity of elastomers typically varies after exposure to high temperatures. This often increases the volume resistivity of an elastomer two or three times that when new. Therefore, the preferred volume resistivity for the invention noted above references the volume resistivity of elastomers after heat-aging, i.e., thermally pre-treating to stabilize the properties of the elastomer. Because elastomers are typically poor conductors of electricity, conductive filler materials may be added to the elastomer to reduce its electrical resistivity. Conductive fillers include, but are not limited to silver, copper, aluminum, nickel and graphite.

Referring to FIG. 5, conductive elastomeric member 107a is brought into contact with front plate sealing surface 121a when chamber isolation valve door 107 is deployed to the fully closed position, as shown in FIG. 4C. Conductive elastomeric member 107a may contact front plate sealing surface along some or all of the periphery of second opening 117. Hence, in this aspect, the contact portion of chamber isolation valve door 107 includes elastomeric sealing member 198 and conductive elastomeric member 107a. Plasma processing is not conducted in plasma processing chamber P unless chamber isolation valve 101 is fully closed, therefore, chamber isolation valve door 107 is grounded whenever plasma processing takes place in processing chamber P, preventing plasma leakage out of processing chamber P.

FIG. 6 is a partial vertical sectional view of chamber isolation valve 101 with a bracing member 109 as shown previously in FIG. 5. Second gap 125 is present between chamber isolation valve door 107 and front plate sealing surface 121a because chamber isolation valve 101 is not deployed in the fully closed, sealed position against front plate sealing surface 121a. In this example, conductive elastomeric member 107a is a P-strip and is mounted along the bottom periphery of chamber isolation valve door 107. An O-strip or D-strip configuration may also be used, depending on the geometry of chamber isolation valve 101. Conductive elastomeric member 107a is mounted to chamber isolation valve door 107 so that a third gap 107b exists between the surface of conductive elastomeric member 107a and front plate sealing surface 121a. There also exists a fourth gap 198a between front plate sealing surface 121a and elastomeric sealing member 198. Elastomers with conductive additives, e.g. those preferred for conductive elastomeric member 107a, tend to be less durable and more prone to particle shedding than those designed for creating a vacuum-tight seal, e.g. elastomers preferred for elastomeric sealing member 198. Hence, conductive elastomeric member 107a is preferably not subjected to large forces during operation of chamber isolation valve 101, such as those experienced by elastomeric sealing member 198. To allow elastomeric sealing member 198 to absorb the majority of the forces that result when sealing chamber opening 102 with chamber isolation valve door 107, it is important that third gap 107b is larger than fourth gap 198a, creating a first clearance C1, as shown in FIG. 6. To ensure that conductive elastomeric member 107a contacts front plate sealing surface 121a when chamber isolation valve door 107 is closed, clearance C1 must be sized to correctly anticipate the compression of elastomeric sealing member 198 that occurs when chamber isolation valve door 107 seals chamber opening 102. Hence, clearance C1 is a function of the size, composition and O-ring groove design of elastomeric sealing member 198, and of the bracing force used to seal chamber opening 102. One skilled in the art, upon reading the disclosure herein can calculate the necessary clearance C1 for any situation.

The primary benefit of this aspect of the invention is the ability to seal plasma generated in chamber P at second opening 117. This prevents plasma from entering valve housing 105 and potentially contaminating and/or damaging components therein. It should be noted, however, that for relatively large process chambers, i.e., chambers processing substrates larger than about 1000 mm×1000 mm, contact between conductive elastomeric member 107a and front plate sealing surface 121a may be broken. This is due to the significant deflection of chamber P's walls that may occur when chamber P is at vacuum. Referring to FIG. 4A, it can be seen that significant inward deflection of chamber P may cause front plate 121 to bow outward from enclosure 113 of valve housing 105. This in turn may weaken or eliminate the electrical connection between conductive elastomeric member 107a and front plate sealing surface 121a. Because of this issue, proper sizing of clearance C1 is important for establishing a reliable ground connection to chamber isolation valve door 107.

Alternatively, electrically conductive elastomeric member 107a may be mounted above chamber opening 102, for example to improve accessibility to conductive elastomeric member 107a and minimize the time required to replace elastomeric member 107a. In this configuration, however, conductive elastomeric member 107a will be repeatedly contacting a surface located directly over the path of substrates being transferred into and out of processing chamber P. Hence, it is generally preferred to mount conductive elastomeric member 107a below chamber opening 102 to minimize potential particle contamination of substrates. In another aspect, conductive elastomeric member 107a may be mounted along the sides of chamber opening 102 to minimize possible particle contamination of substrates while maximizing accessibility from above.

In another aspect of the invention, a conductive elastomeric member 109a is fixedly attached to bracing member 109 and is brought into contact with a grounded component of the plasma processing system when bracing member 109 is deployed to hold chamber isolation valve door 107 in place during substrate processing. Hence, in this aspect, the contact portion of bracing member 109 includes reaction bumpers 109b, 109c and conductive elastomeric member 109a.

Figure 7:
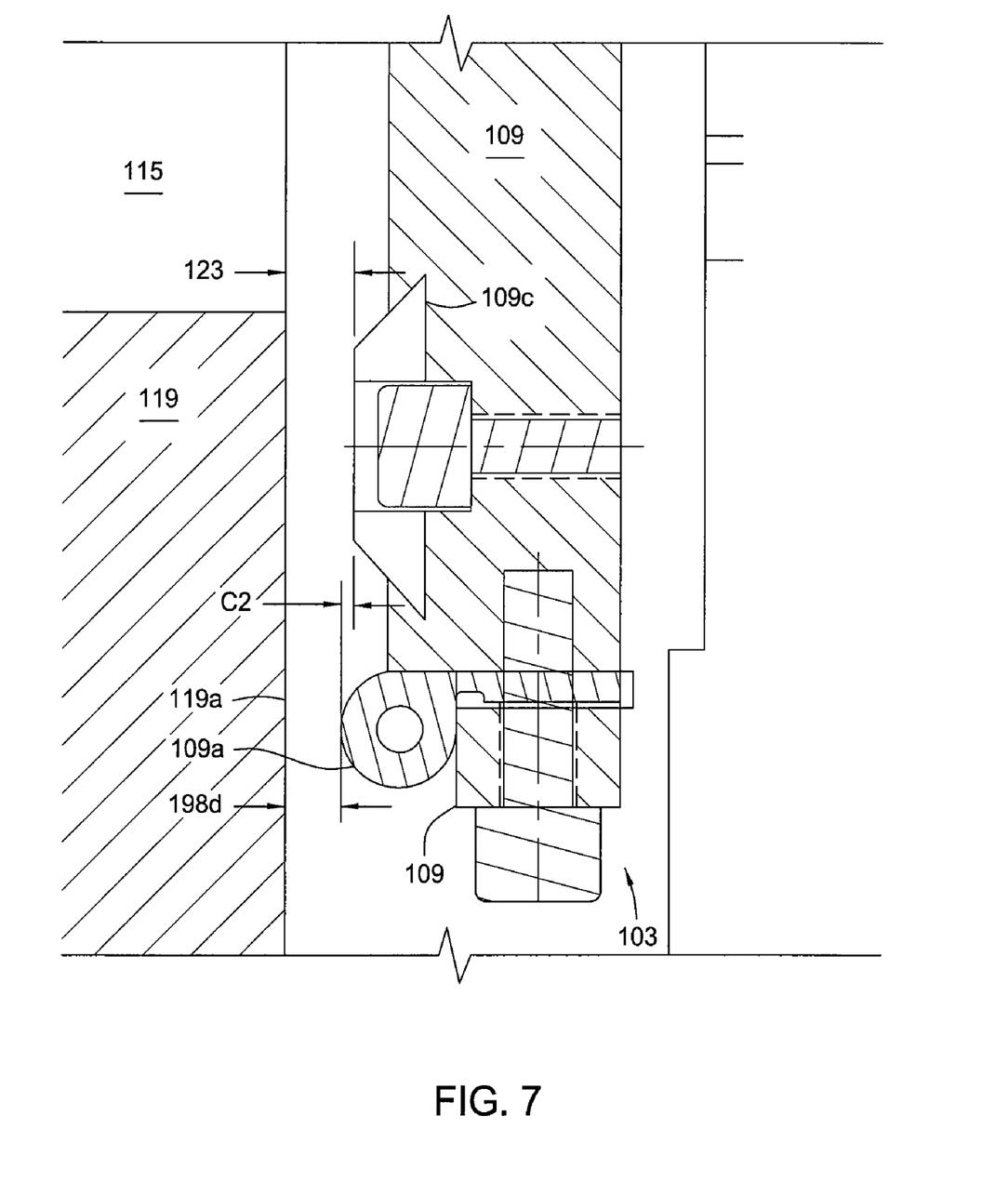
FIG. 7 is another partial vertical sectional view of a chamber isolation valve with a bracing member.

FIG. 7 is another partial side view of chamber isolation valve 101 with a bracing member 109 as shown previously in FIG. 5. First gap 123 is present between bracing member 109 and rear plate surface 119a since bracing member 109 is not deployed against rear plate surface 119a to seal chamber isolation valve door 107 against front plate sealing surface 121a. In this example, conductive elastomeric member 109a is a P-strip and is mounted along the bottom periphery of bracing member 109. An O-strip or D-strip configuration may also be used, depending on the geometry of bracing member 109. Conductive elastomeric member 109a is mounted to bracing member 109 so that a fifth gap 198d exists between the surface of conductive elastomeric member 109a and rear plate surface 119a. Low elasticity of reaction bumpers 109b (not shown in FIG. 7) and 109c is beneficial in transmitting the bracing force to chamber isolation valve door 107. Therefore, because reaction bumpers 109b and 109c are not required to create a vacuum-tight seal when contacting rear plate surface 119a, they are preferably manufactured from more rigid material than elastomeric sealing member 198.

Because reaction bumpers 109b and 109c are typically manufactured from relatively rigid non-metallic materials, fifth gap 198d, i.e., the gap between rear plate surface 119a and conductive elastomeric member 109a, may be slightly smaller than first gap 123. This creates a second clearance C2 between conductive elastomeric member 109a and reaction bumpers 109b and 109c. Clearance C2 ensures that electrical contact is established between closure member 103 and grounded rear plate 119 whenever bracing member 109 deploys against rear plate 119 to brace chamber isolation valve door 107 against front plate 121. Although conductive elastomeric member 109a first contacts rear contact surface 119a, elastomeric member 109a is highly elastic compared to rigid reaction bumpers 109b and 109c. Hence, rigid reaction bumpers 109b and 109c absorb the majority of the bracing force exerted against rear plate 119. In this aspect of the invention, the precise sizing of second clearance C2 is not critical to ensure that the desired electrical contact is made.

As noted above for conductive elastomeric member 107a, conductive elastomeric member 109a may alternatively be mounted above chamber opening 102. This configuration of the invention may improve accessibility, but may potentially increase particle contamination of substrates.

In another aspect, reaction bumpers 109b and 109c may be used as the electrically conductive elastomeric members that electrically ground chamber isolation valve 101 instead of conductive elastomeric member 109a. This configuration of the invention ensures good electrical contact between closure member 103 and rear plate 119. This configuration is only effective, however, if a non-metallic material is used for reaction bumpers 109b and 109c that possesses high durability, low elasticity and low resistivity, which may be problematic. In one configuration, both the upper reaction bumper 109b and lower reaction bumper 109c are used as conductive members. In another configuration, only lower reaction bumper 109c is used.

In another aspect, the electrically conductive elastomeric member used to ground chamber isolation valve 101 is fixedly attached to a grounded component of processing system 10, such as front plate 121 or rear plate 119. A conductive, i.e., typically metallic, member or members of the isolation valve is brought into contact with the elastomeric member attached to front plate 121 or rear plate 119 when chamber isolation valve door 107 is in the closed position.

Figure 8:
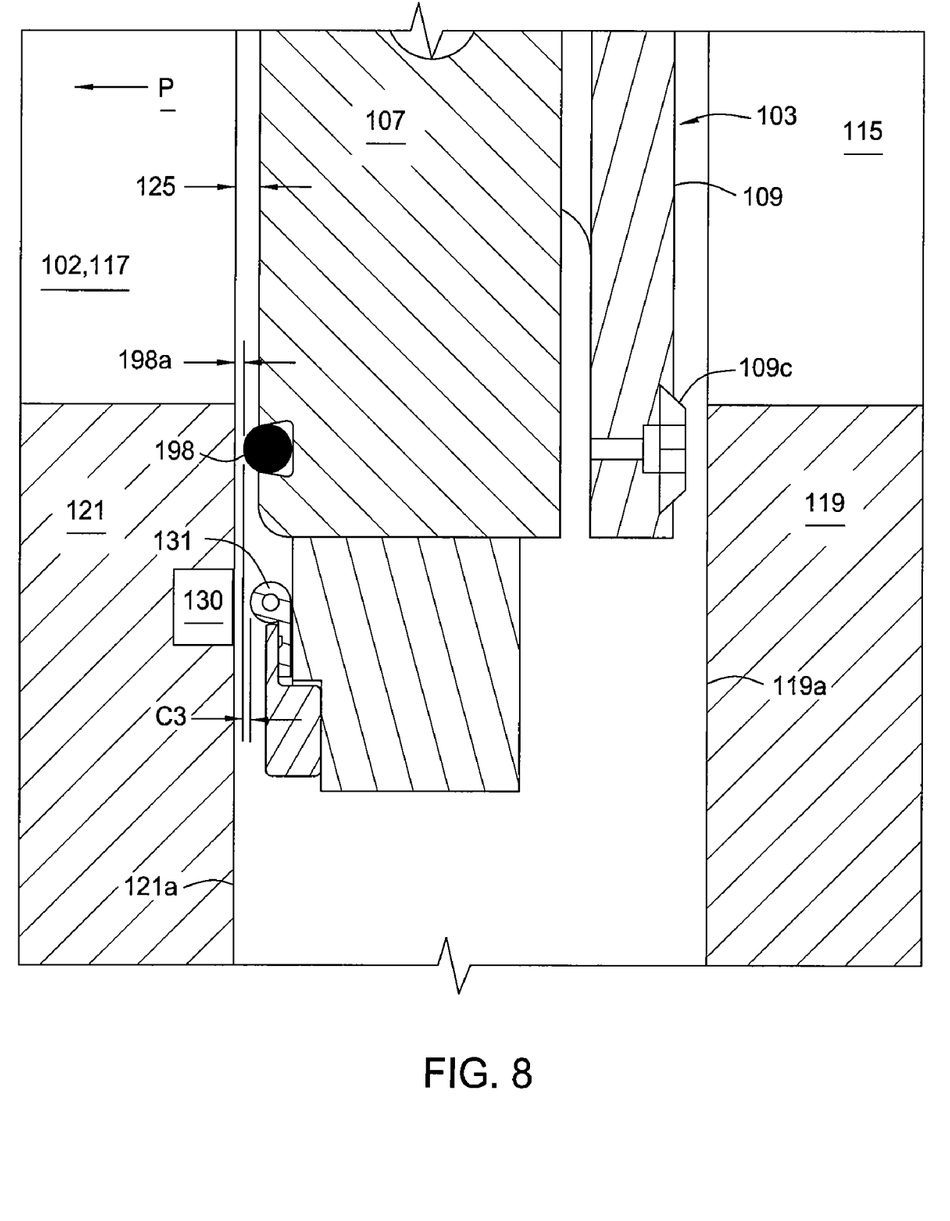
FIG. 8 is a partial vertical sectional view of a chamber isolation valve.

FIG. 8 is a partial side view of chamber isolation valve 101 similar to FIG. 6. In this example, however, a conductive elastomeric member 130 is attached to front plate 121, near the periphery of chamber opening 102 but outside the region sealed by elastomeric sealing member 198. Conductive elastomeric member 130 is preferably embedded into and largely flush with front plate surface 121a so as to maximize the size of gap 125 and minimize potential interference with the motion of closure member 103. Alternatively, in aspects wherein valve housing 105 is not present and chamber isolation valve door 107 is placed in direct contact with the processing chamber P to seal chamber opening 102, conductive elastomeric member 130 may be embedded into the outer wall of processing chamber P. Conductive elastomeric member 130 is configured to be located adjacent to conductive member 131 when chamber isolation valve door 107 is in the closed position. In this example, conductive member 131 is mounted on a lower portion of chamber isolation valve door 107 and below the region sealed by elastomeric sealing member 198 when chamber isolation valve door 107 is in the closed position. In other configurations, conductive member 131 may be mounted anywhere peripherally on chamber isolation valve door 107 such that it contacts conductive elastomeric member 130 outside of the region sealed by elastomeric sealing member 198 when chamber isolation valve door 107 is in the closed position. FIG. 8 shows the preferred configuration of this aspect of the invention, i.e., conductive member 131 mounted on a lower portion of chamber isolation valve door 107.

As with an earlier aspect of the invention, conductive member 131 must be configured so that a clearance C3 is present between elastomeric sealing member 198 and conductive member 131. This allows elastomeric sealing member 198 to compress sufficiently without interference by conductive member 131 when chamber isolation valve door 107 is in the closed position to create a vacuum-tight seal around chamber opening 102.

In another configuration of this aspect of the invention, reaction bumper 109b and/or 109c may be used to electrically ground chamber isolation valve 101 by establishing a ground path by contacting rear plate 119. In this configuration of the invention, however, reaction bumpers 109b and/or 109c are typically manufactured from a metallic material and a conductive elastomeric member 132 is attached to rear plate 119. This is shown in FIG. 9.

Figure 9:
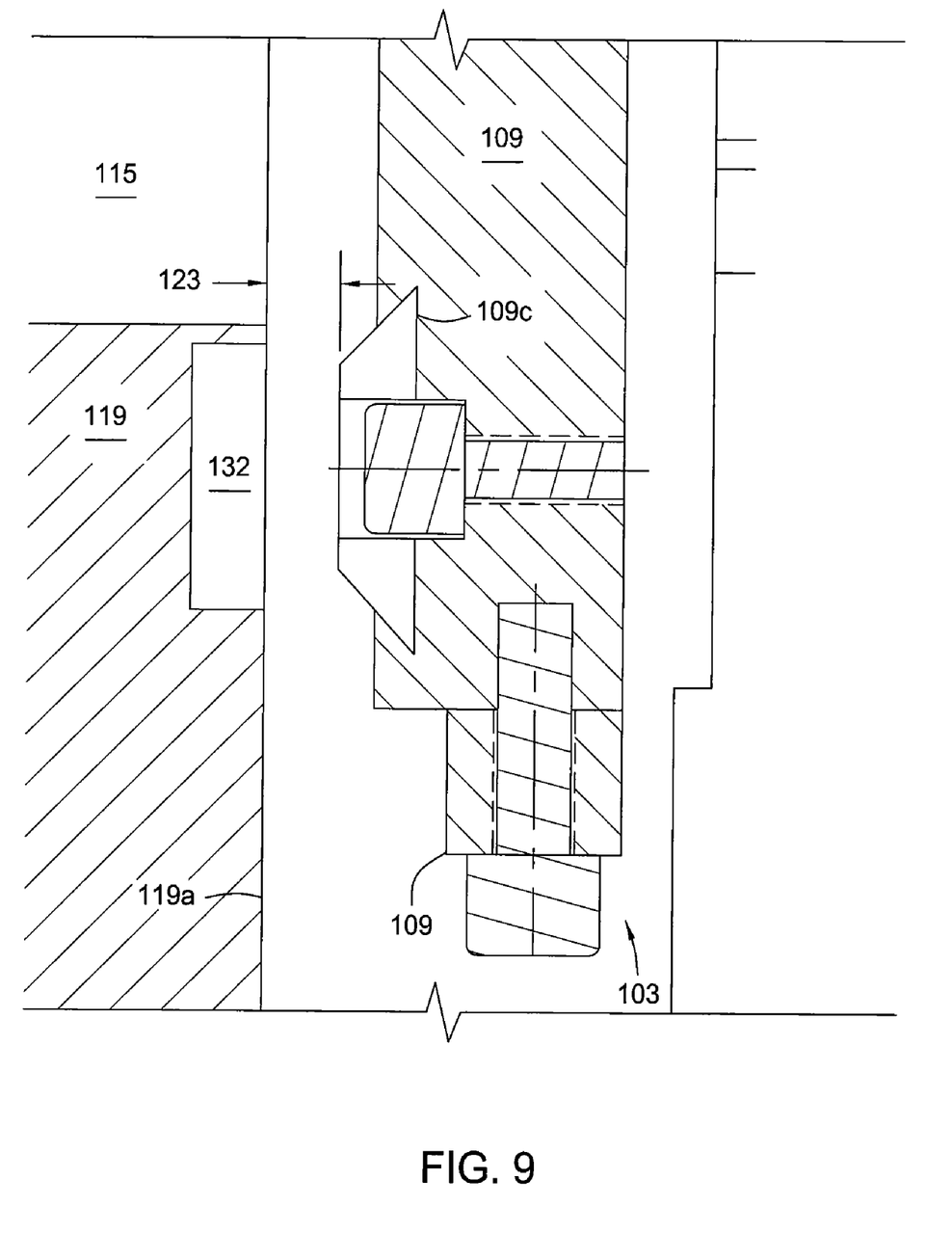
FIG. 9 is a partial vertical sectional view of a chamber isolation valve.

FIG. 9 is a partial vertical sectional view of chamber isolation valve 101 similar to FIG. 7. In this example, however, a conductive elastomeric member 132 is attached to rear plate 119, near the periphery of first opening 115. First gap 123 is present between reaction bumpers 109c and rear plate surface 119a since bracing member 109 is not deployed against rear plate surface 119a to seal chamber isolation valve door 107 against front plate sealing surface 121a (element 121a is not shown in FIG. 9).

Conductive elastomeric member 132 is preferably embedded into and largely flush with rear plate surface 119a so as to maximize the size of gap 123 and minimize potential interference with the motion of closure member 103. Conductive elastomeric member 132 is configured to be located adjacent to reaction bumper 109c when chamber isolation valve door 107 is in the closed position. In this example, reaction bumper 109c is shown as the conductive member of closure member 103 that establishes an electrical ground to rear plate surface 119a. In other configurations, any or all reaction bumpers may be adapted to contact elastomeric member 132. It is generally preferred to make the desired grounding contact for closure member 103 with lower reaction bumper or bumpers 109c, as shown in FIG. 9. Alternatively, another conductive member fixed to bracing member 109 may be used to establish electrical contact instead of reaction bumpers 109b and c.

In operation, the electrical contact required is established in this configuration of the invention as reaction bumper 109c exerts a bracing force against conductive elastomeric member 132 embedded in rear plate surface 119a. Therefore, closure member 103 is electrically grounded whenever chamber isolation valve door 107 is in the closed position and plasma leakage is prevented.

Figure 6A:
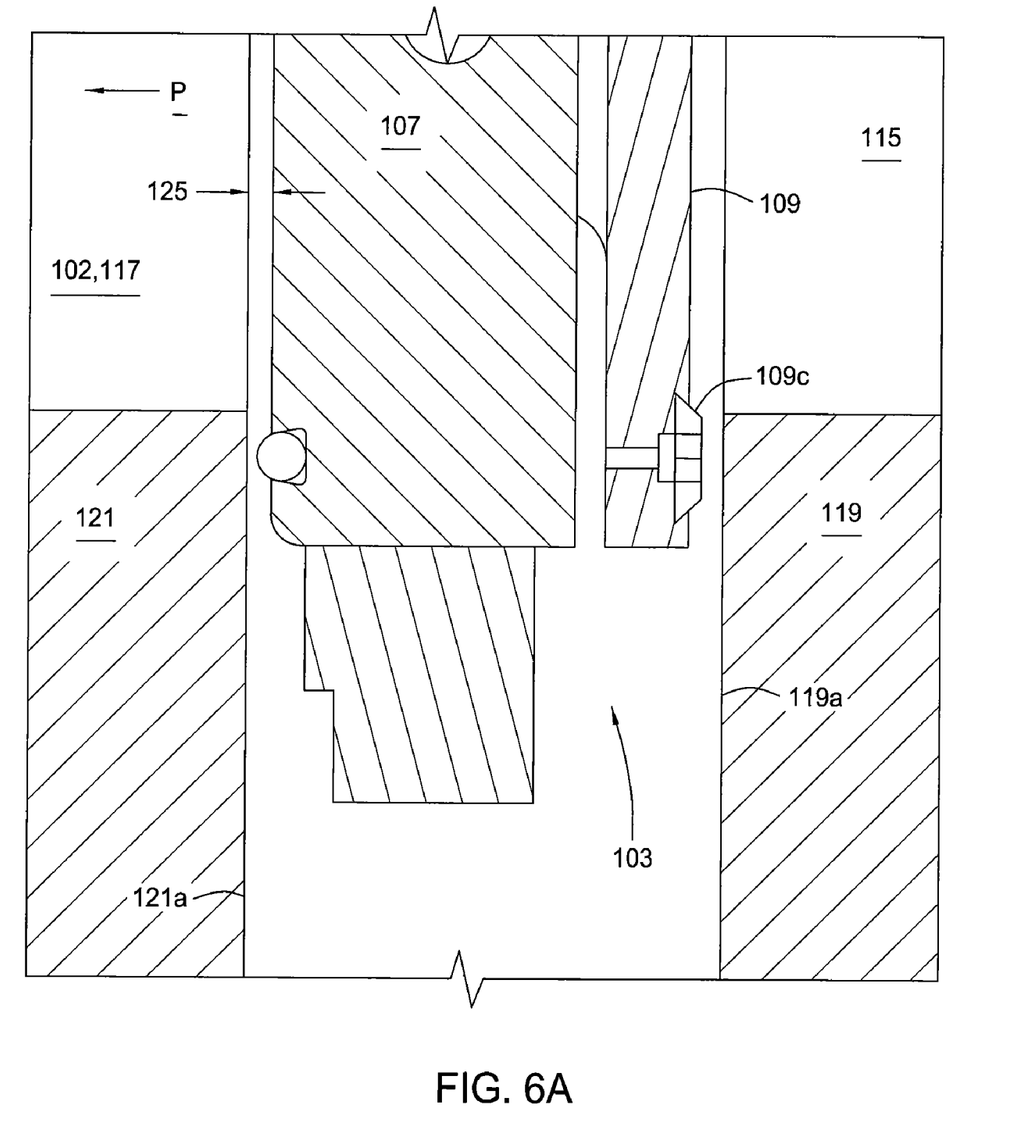
FIG. 6A is a partial vertical sectional view of a chamber isolation valve with a bracing member.

In a final aspect of the invention, elastomeric sealing member 198 may itself consist of a conductive elastomer (as shown in FIG. 6A), obviating the need for the use of an additional elastomeric conductive member, such as elastomeric member 107a shown in FIG. 6. The ground path for chamber isolation valve door 107 may then pass directly through elastomeric sealing member 198 to front plate sealing surface 121a. Because electrically conductive elastomers are generally less durable and more likely to create particles over time than standard sealing elastomers, preferred aspects of the invention make use of one or more auxiliary, non-load-bearing elastomeric members composed of an electrically conductive material.

While the foregoing is directed to embodiments of the present invention, other and further embodiments of the invention, such as combining multiple aspects of the invention, may be devised without departing from the basic scope thereof, and the scope thereof is determined by the claims that follow.

The invention claimed is:

1. A grounded chamber isolation valve for a plasma processing system, comprising:
   a door and a bracing member movably attached to and opposing the door;
   at least one or more elastomeric door sealing members coupled to the door; and
   at least one electrically conductive member in electrical communication with the door, the at least one electrically conductive member comprising a plurality of reaction bumpers disposed on a top and bottom of the bracing member that are adapted to contact at least one grounded component of the plasma processing system when the door is in the closed position while preventing direct contact between the bracing member and the at least one grounded component.

2. The chamber isolation valve of claim 1, wherein the elastomeric member is an elastomeric extrusion, wherein the elastomeric extrusion is selected from the group consisting of an O-strip, a D-strip or a P-strip.

3. The chamber isolation valve of claim 1, wherein the reaction bumper comprises a metallic material.

4. The chamber isolation valve of claim 3, wherein the metallic material comprises a conductive metal filler disposed in an elastomeric material.

5. A grounded chamber isolation valve for a plasma processing system, comprising:
   a door and a bracing member movably attached to and opposing the door; and
   an elastomeric member coupled to the door; and
   a plurality of electrically conductive surfaces disposed on the bracing member that are in electrical communication with the door and adapted to contact at least one grounded component of the plasma processing system when the door is in the closed position, wherein each of the plurality of electrically conductive surfaces comprise an electrically conductive member.

6. The chamber isolation valve of claim 5, wherein the electrically conductive member comprises one or more reaction bumpers.

7. The chamber isolation valve of claim 5, wherein the electrically conductive member is an elastomeric extrusion, wherein the elastomeric extrusion is selected from the group consisting of an O-strip, a D-strip or a P-strip.

8. The chamber isolation valve of claim 5, wherein the elastomeric member comprises a sealing member of the door.

9. The chamber isolation valve of claim 5, wherein the door and bracing member are disposed in a valve housing and the at least one grounded component of the plasma processing system is a surface of the valve housing.

10. The chamber isolation valve of claim 5, wherein the at least one grounded component of the plasma processing system comprises a chamber opening sealing surface.

11. The chamber isolation valve of claim 5, wherein the electrically conductive member comprises a metallic material.

12. An apparatus, comprising:
    a closure member movably disposed between a first opening in a first chamber and a second opening in a second chamber, the closure member comprising:
      a door; and
      a bracing member, the door and the bracing member being movable relative to each other, the bracing member comprising a plurality of conductive members disposed thereon; and
    an elastomeric door sealing member disposed on and extending from the door, the bracing member electrically coupling the door and a sealing surface proximate the first opening when the bracing member and the door are moved away from each other.

13. The apparatus of claim 12, wherein the closure member is disposed in a housing and the door and the bracing member are movable relative to the housing.

14. The apparatus of claim 12, wherein each of the plurality of conductive members comprise a reaction bumper.

15. The apparatus of claim 12, wherein a first portion of the plurality of conductive members comprises one or more reaction bumpers and a second portion of the plurality of conductive members comprises an elastomeric material.

16. The apparatus of claim 15, wherein the elastomeric material comprises an elastomeric extrusion.

17. The apparatus of claim 16, wherein the elastomeric extrusion is selected from the group consisting of an O-strip, a D-strip or a P-strip.

18. A grounded chamber isolation valve for a plasma processing system, comprising:

a door and a bracing member movably attached to and opposing the door;

at least one elastomeric sealing members disposed on the door;

a plurality of reaction bumpers disposed on the bracing member that are adapted to buttress the door when the door is in the closed position; and one or more electrically conductive members in electrical communication with the door comprising:

at least one electrically conductive elastomeric member disposed on the door adapted to contact at least one grounded component of the plasma processing system when the door is in the closed position to act as an electrical ground path for the door, wherein the at least one electrically conductive elastomeric member does not protrude beyond the at least one or more elastomeric sealing member.

19. The chamber isolation valve of claim 18 further comprises a housing having an opening adapted to be sealed by the door, wherein the at least one electrically conductive elastomeric member is disposed at a location below the at least one elastomeric sealing member and below the opening when the door is in a closed position.

* * * * *